United States Patent
Visokay (10) Patent No.: US 7,163,880 B2
(45) Date of Patent: Jan. 16, 2007

(54) GATE STACK AND GATE STACK ETCH SEQUENCE FOR METAL GATE INTEGRATION

(75) Inventor: Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 10/860,086

(22) Filed: Jun. 2, 2004

(65) Prior Publication Data

US 2005/0269672 A1    Dec. 8, 2005

(51) Int. Cl.
*H01L 21/4763* (2006.01)
(52) U.S. Cl. .................. 438/592; 438/717; 438/786
(58) Field of Classification Search ........... 438/786, 438/620
See application file for complete search history.

(56) References Cited

U.S. PATENT DOCUMENTS

| | | | |
|---|---|---|---|
| 5,441,914 A * | 8/1995 | Taft et al. ............. | 438/592 |
| 6,028,002 A * | 2/2000 | Thakur ............... | 438/647 |
| 6,037,266 A * | 3/2000 | Tao et al. ............ | 438/719 |
| 6,049,114 A * | 4/2000 | Maiti et al. .......... | 257/412 |
| 6,236,091 B1 | 5/2001 | Ngo et al. | |
| 6,274,425 B1 * | 8/2001 | Park .................. | 438/241 |
| 6,297,170 B1 * | 10/2001 | Gabriel et al. ....... | 438/738 |
| 6,902,969 B1 * | 6/2005 | Adetutu et al. ...... | 438/199 |
| 2004/0023478 A1 * | 2/2004 | Samavedam et al. ... | 438/592 |

OTHER PUBLICATIONS

B.E.E. Kastenmeier et al.; 'Chemical Dry Etching of Silicon Nitride and Silicon Dioxide Using CF4/O2/N2 Gas Mixtures'; 1996 American Vacuum Society; J. Vac. Sci. Technol. A 14(5), Sep./Oct. 1996, pp. 2802-2813.

* cited by examiner

Primary Examiner—Stephen W. Smoot
(74) Attorney, Agent, or Firm—Jacqueline J. Garner; W. James Brady, III; Frederick J. Telecky, Jr.

(57) ABSTRACT

The present invention provides, in one embodiment, a process for fabricating a metal gate stack (200) for a semiconductor device (205). The process includes depositing a metal layer (210) over a gate dielectric layer (215) located over a semiconductor substrate (220). The process further includes forming a polysilicon layer (225) over the metal layer (210) and creating a protective layer (230) over the polysilicon layer (225). The process also includes placing an inorganic anti-reflective coating (235) over the protective layer (230). Other embodiments include a metal gate stack precursor structure (100) and a method of manufacturing an integrated circuit (300).

8 Claims, 14 Drawing Sheets

GATE STACK AND GATE STACK ETCH SEQUENCE FOR METAL GATE INTEGRATION

TECHNICAL FIELD OF THE INVENTION

The present invention is directed in general to semiconductor devices and the manufacture of semiconductor devices and, more specifically, to manufacturing metal gate stack structures for semiconductor devices.

BACKGROUND OF THE INVENTION

The use of transistor gate electrodes made of doped polysilicon has long been used in the manufacture of metal oxide silicon (MOS) transistors. The use of doped polysilicon gates becomes problematic, however, as the dimensions of gates and gate dielectrics are reduced. Polysilicon gates can accommodate only a finite amount of dopants. This limitation can result in a depletion of gate charge carriers at the interface between the gate and gate dielectric, when the gate electrode of a device is biased to invert the channel. Consequently, the electrical thickness of the gate dielectric is substantially increased, thereby deteriorating the performance characteristics of the transistor, such as reducing the drive current and switching speed. For instance, the electrical thickness of a gate dielectric in some pMOS transistors can increase from about 1.0 nanometer during accumulation mode, to about 1.8 nanometers during inversion mode. Depletion of the polysilicon gate is a fundamental issue limiting further scaling of MOS devices.

Metal gate stacks are an attractive alternative to polysilicon gates because they have a larger supply of charge carriers than doped polysilicon gates. Metal gates stacks have a lower metal layer and an upper polysilicon layer. When a metal gate stack is inverted, there is no substantial depletion of carriers at the interface between the metal gate layer and the gate dielectric. Accordingly, the transistor's performance is not deteriorated because the electrical thickness of the gate stack is not increased. The integration of manufacturing processes for fabricating metal gate stacks into existing of semiconductor transistors manufacturing processes has been troublesome, however.

Consider, for instance, a conventional gate manufacturing process. Such a process typically involves patterning a polysilicon layer to form a polysilicon gate using photolithography techniques. A photoresist layer and underlying inorganic antireflective coating (IARC) are deposited on the polysilicon layer. The photoresist layer is patterned to define the gate's perimeter, and then removed, leaving the IARC on the polysilicon layer. The IARC is then used as an etch mask for patterning the polysilicon layer to form the polysilicon gate. The IARC is then stripped away using a wet etching process, such as a hot phosphoric acid solution containing a metal removal agent.

If the same process is used to fabricate a metal gate stack, significant problems are encountered. Of course, the IARC can be still be used as the etch mask to pattern the polysilicon and metal layer to form the metal gate stack. However, the wet etch process used to remove the IARC is highly corrosive to the metal in the metal gate stack, thereby causing substantial undercutting of the metal portion of the gate. An undercut metal gate layer, in turn, results in several problems, including a modified gate length, poor definition of source/drain and shallow junction structures, and an increased tendency for the metal gate stack to peel off during subsequent processing steps.

Accordingly, what is needed in the art is a process for fabricating a metal gate stack that is not subject to the same problems as conventional gate fabrication processes and yet is readily incorporated into a method for manufacturing semiconductor devices.

SUMMARY OF THE INVENTION

To address the above-discussed deficiencies of the prior art, one embodiment of the present invention is directed to a process for fabricating a metal gate stack for a semiconductor device. The method includes depositing a metal layer over a gate dielectric layer located over a semiconductor substrate. The method further includes forming a polysilicon layer over the metal layer and creating a protective layer over the polysilicon layer. The placing also includes placing an inorganic anti-reflective coating over the protective layer.

Another embodiment is directed to a metal gate stack precursor structure. The metal gate stack precursor structure includes a substrate having a gate dielectric layer thereon and a metal layer over the gate dielectric layer. The metal gate stack precursor structure also has a polysilicon layer over the metal layer. A protective layer is on the polysilicon layer and an inorganic anti-reflective coating is over the protective layer.

Still another embodiment is directed to a method of manufacturing an integrated circuit. The method includes forming a metal gate stack in an active device, as described above. The manufacture of the integrated circuit further includes connecting the active device to an interconnecting metal line located on one of more insulating layers located over the active device to form an operative integrated circuit.

The foregoing has outlined preferred and alternative features of the present invention so that those of ordinary skill in the art may better understand the detailed description of the invention that follows. Additional features of the invention described hereinafter can also form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention proposes the use of an unconventional process to form a metal gate stack structure in a semiconductor device. The unconventional process features the earlier stripping of the IARC, the use of a dry chemical etch for IARC stripping, and creating a protective layer over the polysilicon layer. These features cooperate to form the metal gate stack while avoiding damage to the metal portion of the gate, as well as to other components of the semiconductor device.

The IARC is stripped before patterning a metal layer to form the metal gate layer in the metal gate stack. Stripping of the IARC early in the process flow, and using a dry chemical etch for IARC stripping, each help avoid undercutting of the metal gate layer. Moving the stripping step earlier in the process also helps avoid substantial recessing of the semiconductor substrate that otherwise would be associated with the dry chemical etch method. The protective layer, located between the polysilicon layer and the IARC, serves as an etch mask, thereby preventing removal of the polysilicon layer during metal layer patterning.

Figure 1:
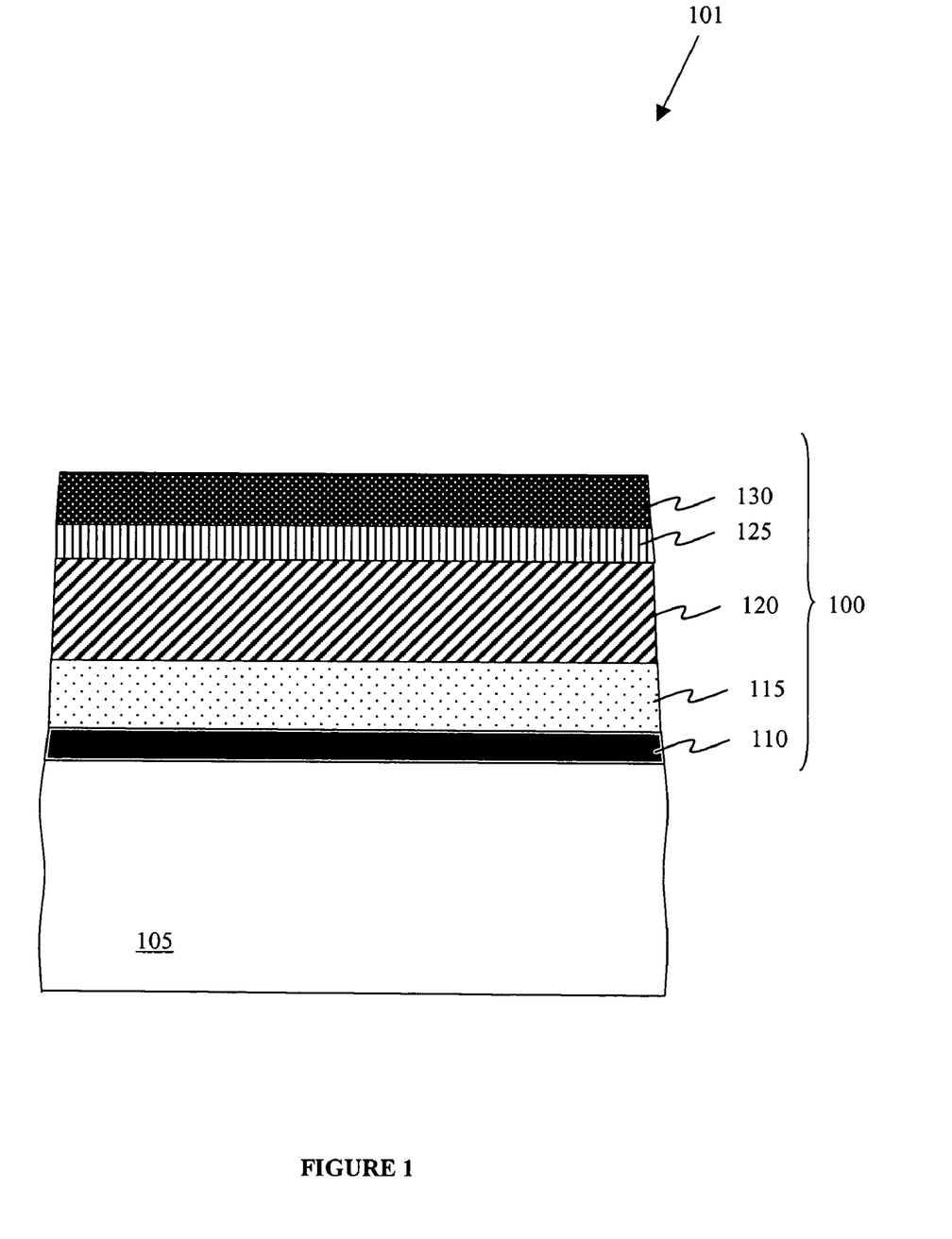
FIG. 1 illustrates a metal gate stack precursor structure manufactured according to the principles of the present invention.

One embodiment of the present invention, illustrated in FIG. 1, is a metal gate stack precursor structure 100. The precursor structure 100 can be further processed, such as described below, to form a metal gate stack in a conventional semiconductor device 101, including MOS transistors, such as PMOS and nMOS transistors. The precursor structure 100, comprises a substrate 105 having a gate dielectric layer 110 thereon. The substrate 105 is preferably single crystal silicon, although other semiconductor substrates can be used. The precursor structure 100 further includes a metal layer 115 over the gate dielectric layer 110, and a polysilicon layer 120 over the metal layer 115. As further illustrated in FIG. 1, the precursor structure 100 also has a protective layer 125 on the polysilicon layer 120, and an IARC 130 over the protective layer 125.

Any conventional gate insulating material can be used as the gate dielectric layer 110. In some cases, for example, the gate dielectric layer 110 is silicon dioxide. In other cases, the gate dielectric layer 110 is a high k-dielectric material, such as hafnium silicon oxynitide or hafnium dioxide. More preferably, the gate dielectric is made of silicon oxynitride (SiON).

A silicon oxynitride gate dielectric layer 110 is preferred over a silicon dioxide gate dielectric for several reasons. Silicon oxynitride retards dopant penetration from the polysilicon portion of the metal gate stack into the gate dielectric. A silicon oxynitride gate dielectric has a lower leakage current than silicon dioxide gate dielectrics. In addition, silicon oxynitride gate dielectrics have a higher gate capacitance as compared to a silicon dioxide gate dielectric, resulting in a lower equivalent gate oxide thickness.

As is well known to those skilled in the art, a thin gate dielectric layer 110 is conducive to improving the performance characteristics of semiconductor devices. In some preferred embodiments, for instance, the gate dielectric layer 110 has a thickness of less than about 2.0 nanometers, and more preferably between about 0.8 nanometers and about 2.0 nanometers. A thin gate dielectric layer 110, however, is also more prone to inadvertent removal or damage during device fabrication. As an example, the process for stripping the IARC 130 can also substantially remove the gate dielectric, as well as portions of the substrate 105, resulting in recessing. Recessing of the substrate 105 near the metal gate stack 100 would degrade device performance because there would be an increased distance between shallow junctions and the channel region of the semiconductor device, resulting in a lower drive current. In the present invention, as further discussed below, these deleterious effects are avoided by performing IARC stripping earlier in the metal gate stack fabrication process than hitherto conducted.

In some preferred embodiments, the polysilicon layer 120 has a thickness of between about 50 and about 200 nanometers, and the metal layer has a thickness of between about 1 and 10 nanometers. The metal layer 115 preferably comprises a refractory metal. For the purposes of the present invention, a refractory metal is defined as any element in Groups 4–6 and Periods 4–6 of the Periodic Table of Elements, as well as elements in the Lanthanide and Actinide series (International Union of Pure and Applied Chemist Convention for designating Groups and Periods). More preferably, the metal layer is a nitride or a silicide of a refractory metal, such as titanium nitride.

The protective layer 125 can be any material that is more resistant to removal than the IARC 130 by the IARC stripping procedure. When the IARC 130 is made of silicon oxynitride, for instance, it is advantageous for the protective layer 125 to be substantially nitrogen-free. Because a nitrogen-free protective layer 125 can have an etch rate that is substantially lower than that of silicon oxynitride, the dry chemical etch used for IARC stripping can selectively remove the IARC 130, while leaving the protective layer 125 substantially intact. Examples of suitable materials for the protective layer 125 include silicon carbide, and more preferably, silicon dioxide. A silicon dioxide protective layer 125 has the additional benefit of being easily removed by a conventional wet etch process, such as an aqueous HF bath, that does not affect the metal layer 115 remaining in the metal gate stack.

Preferably, the protective layer 125 is sufficiently thick to serve as an etch mask during metal layer 115 etching and protect the polysilicon layer 120 from damage. In some advantageous embodiments, the protective layer has a thickness of between about 10 and 20 nanometers, although other thicknesses are also within the scope of the present invention. Moreover, one skilled in the art would understand how to adjust the thickness of the protective layer 125 such that it can still be easily removed-during the course of the semiconductor device manufacturing process, or to avoid affecting the optical properties of the IARC 130.

Preferably, the IARC 130 is made of silicon oxynitride. As is well known to those of ordinary skill in the art, silicon oxynitride is an advantageous anti-reflective material. For instance, silicon oxynitride's optical properties can be adjusted to suit different photolithography processes, by adjusting the proportions of Silicon, Oxygen and Nitrogen of the IARC 130. In some preferred embodiments, the IARC 130 has a thickness of between about 10 and about 50 nanometers.

FIGS. 2A to 2J illustrate another embodiment of the present invention, a process for fabricating a metal gate stack 200 for a semiconductor device 205. FIGS. 2A to 2J present sectional views of selected steps of an exemplary process according to the principles of the present invention. Any of the embodiments of the metal gate precursor structure described above in the context of FIG. 1, can be used in the process depicted in FIGS. 2A to 2J, or in other embodiments of the process.

Figure 2A:
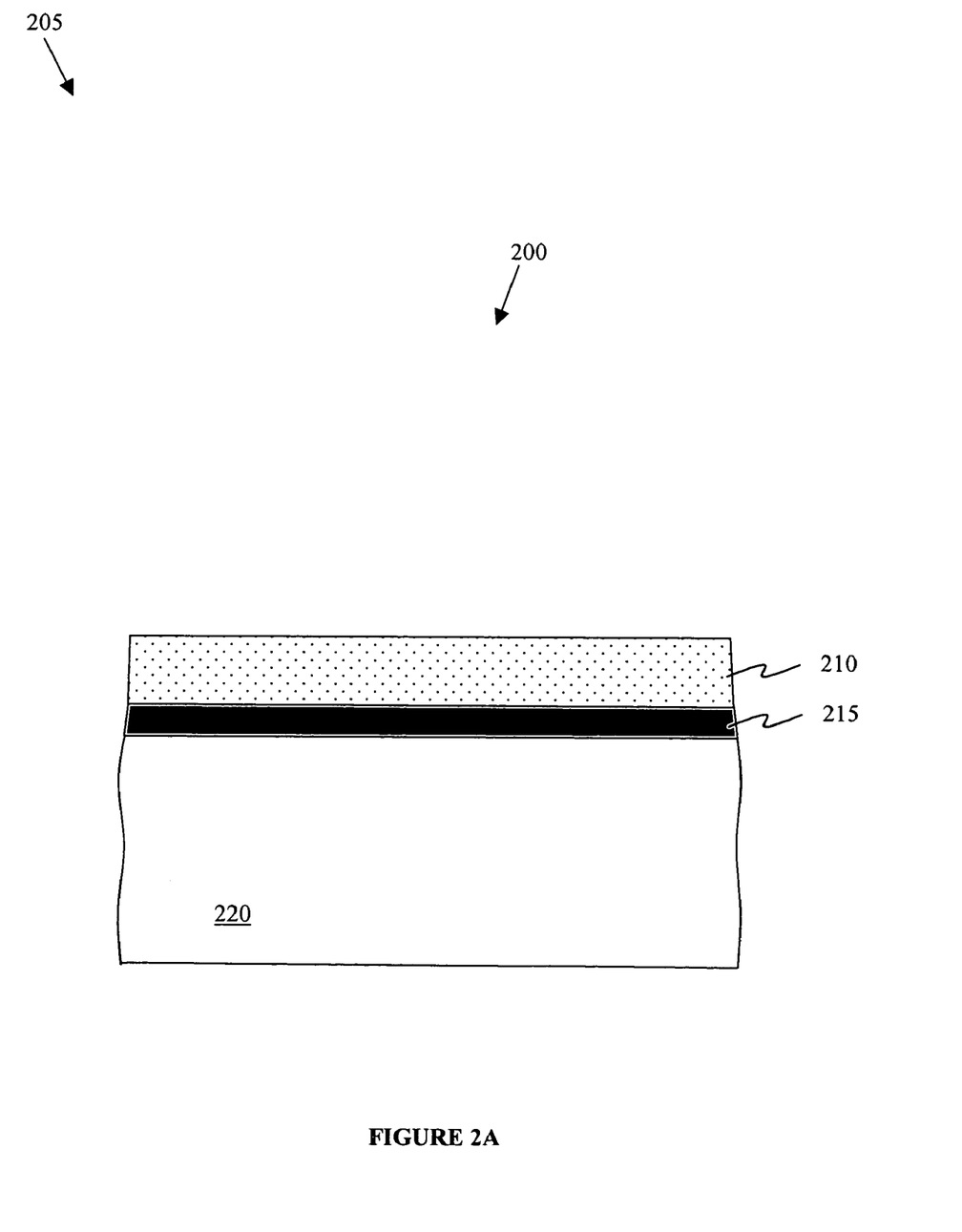
FIGS. 2A to 2J illustrate sectional views of selected steps in a method of forming a metal gate stack structure for a semiconductor device according to the principles of the present invention.
Figure 2B:
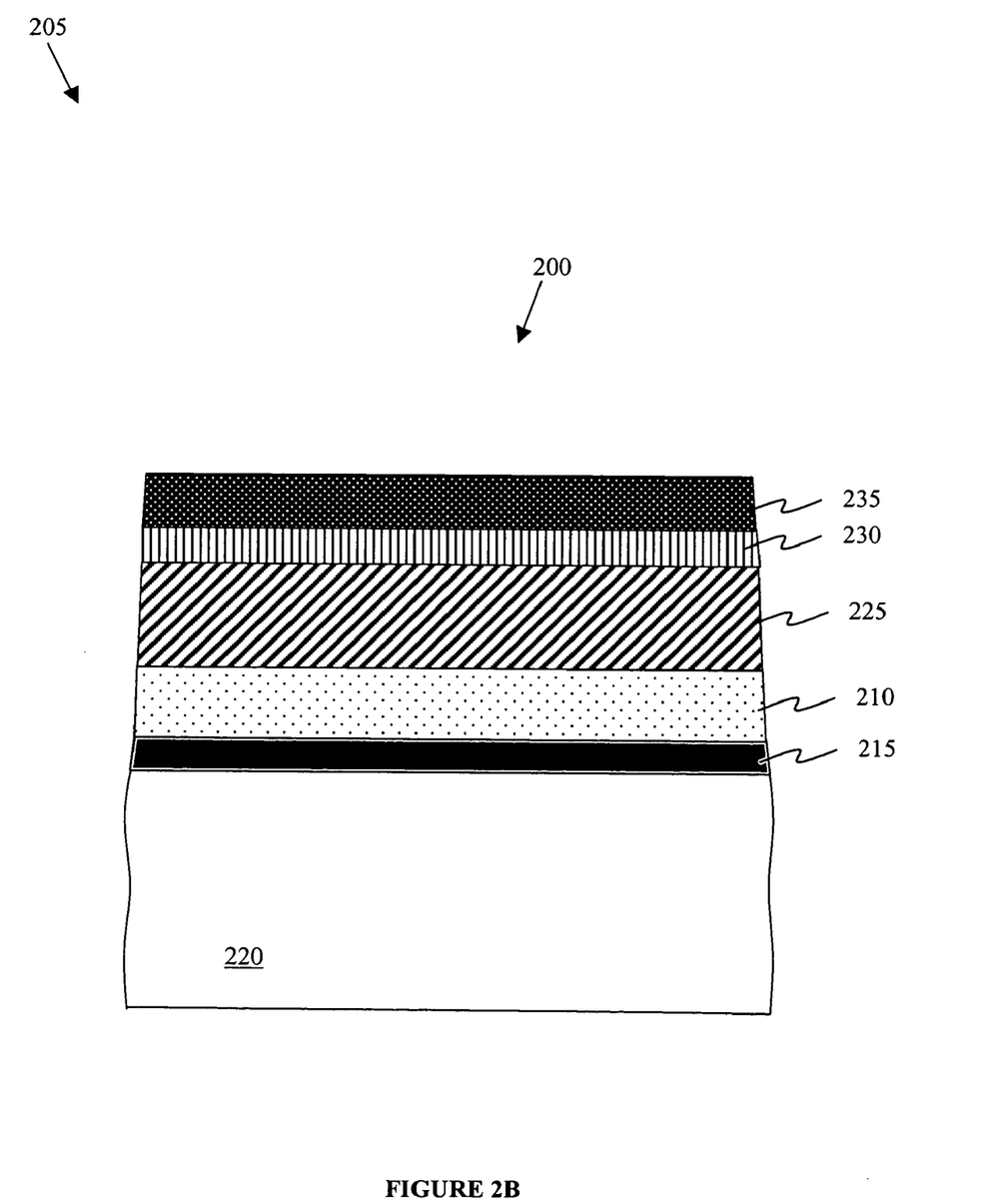

Turning to FIG. 2A, illustrated is the partially completed metal gate stack 200 after depositing a metal layer 210 over a gate dielectric layer 215 located over a semiconductor substrate 220. With continuing reference to FIG. 2A, FIG. 2B depicts the partially completed metal gate stack 200 after forming a polysilicon layer 225 over the metal layer 210, creating a protective layer 230 over the polysilicon layer 225, and placing an IARC 235 over the protective layer 230.

Any conventional methods can be used to deposit the metal layer 210, gate dielectric layer 215, and polysilicon layer 225, protective layer 230 and IARC 235. Such methods include including atomic layer deposition (ALD), physical vapor deposition (PVD), chemical vapor deposition (CVD), and spin coating, or other procedures well known to those skilled in the art.

For instances, in some embodiments, where the gate dielectric layer 215 and the IARC 235 are both made of silicon oxynitride, silicon dioxide can be thermally grown, followed by nitridation, via an $NH_3$ anneal or a plasma nitridation process. Of course, the proportions of silicon, oxygen and nitrogen in the gate dielectric layer 215 and the IARC 235 can be markedly different from each other, in order to accommodate the different functions of the gate dielectric layer 215 and the IARC 235. Moreover, the gate dielectric layer 215 and the IARC 235 can be formed using two entirely different procedures.

Figure 2C:
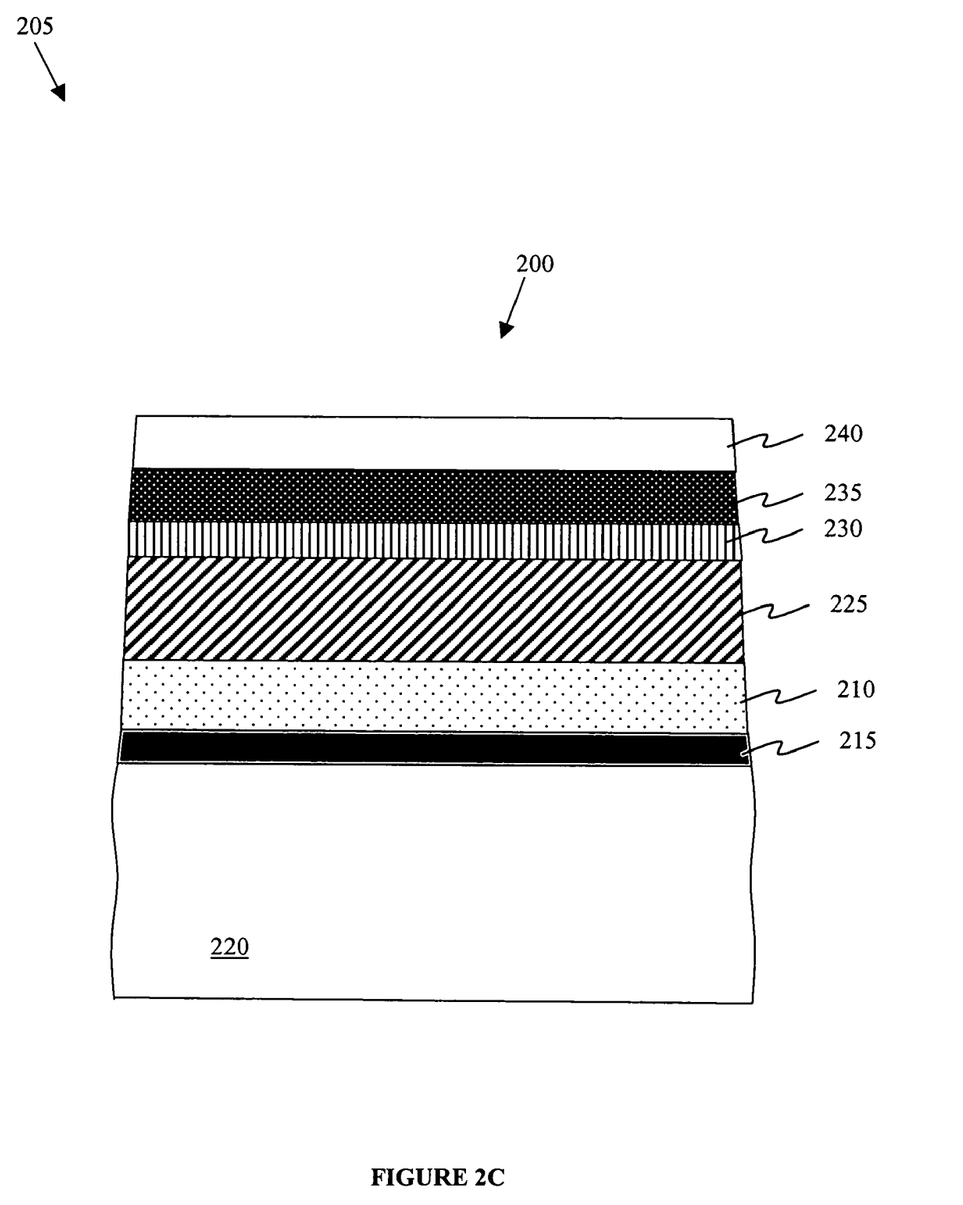
Figure 2D:
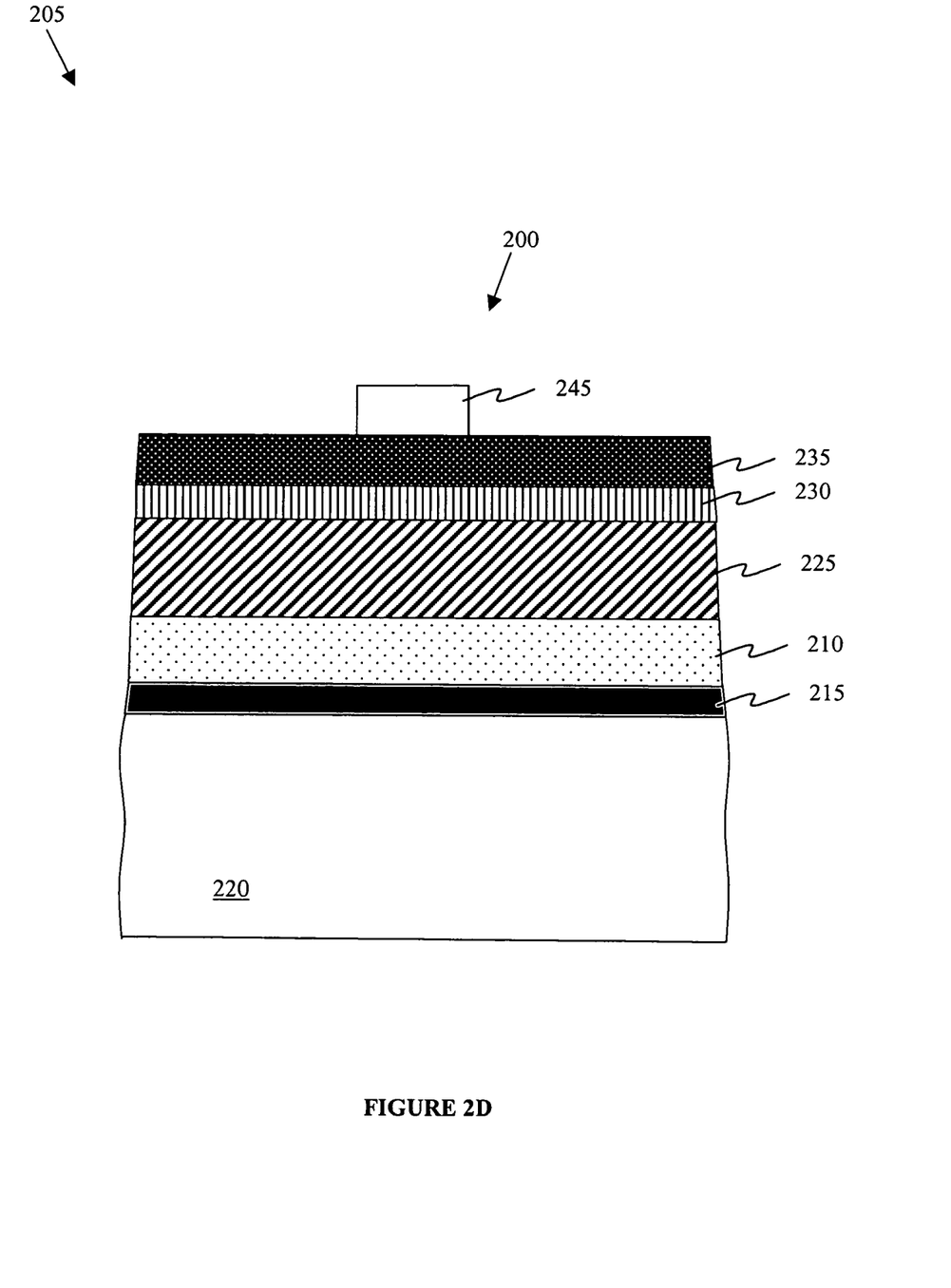

With continuing reference to FIG. 2B, FIG. 2C illustrates the partially completely metal gate stack 200 after depositing a resist layer 240 over the IARC 235. With continuing reference to FIG. 2C, FIG. 2D shows the partially completed metal gate stack 200 after patterning the resist layer 240 to form a patterned structure 245 for the metal gate stack 200. One of ordinary skill in the art would understand that any number of conventional techniques can be used for patterning. Such techniques include lithographic processes commonly used to fabricate devices such as integrated circuit devices, optical devices, micro-electromechanical (MEMS) devices, etc. In a typical lithographic process, a patterned structure is defined and developed in an energy sensitive material also known as a resist. The patterned structure is then used as an etch mask to transfer the pattern into a layer of material underlying the resist. Any number of radiation sources, such as visible or ultraviolet light, can be used to facilitate pattern transfer.

Figure 2E:
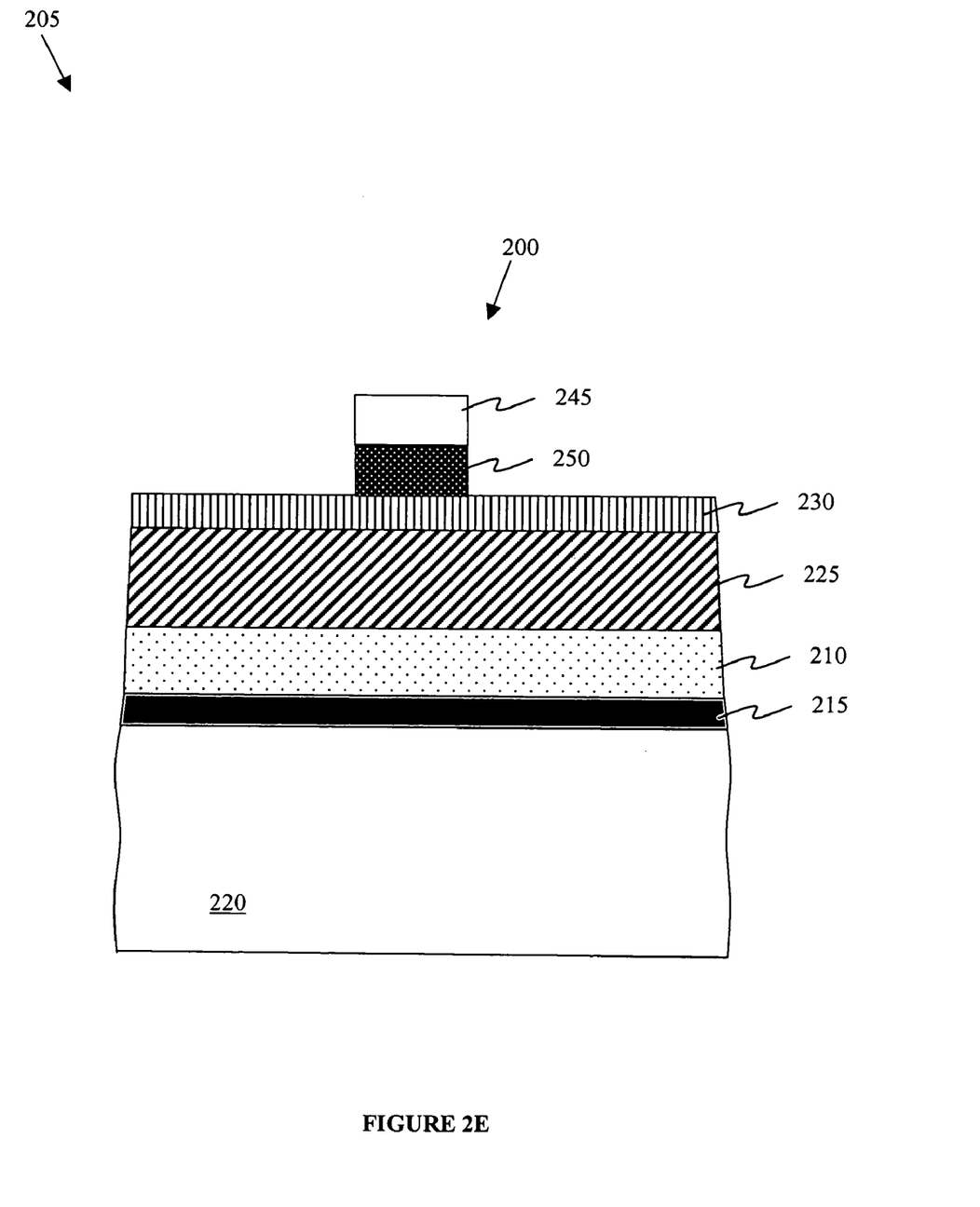

Turning now to FIG. 2E, shown is the partially completely metal gate stack 200 after etching the IARC 235, using the patterned structure 245 as a mask to provide an IARC mask 250. Any conventional process can be used to remove those portions of the IARC 235 not under the patterned structure 245. In some embodiments, an anisotropic dry chemical etch process, such as further described below is preferably used to etch the IARC 235.

Figure 2F:
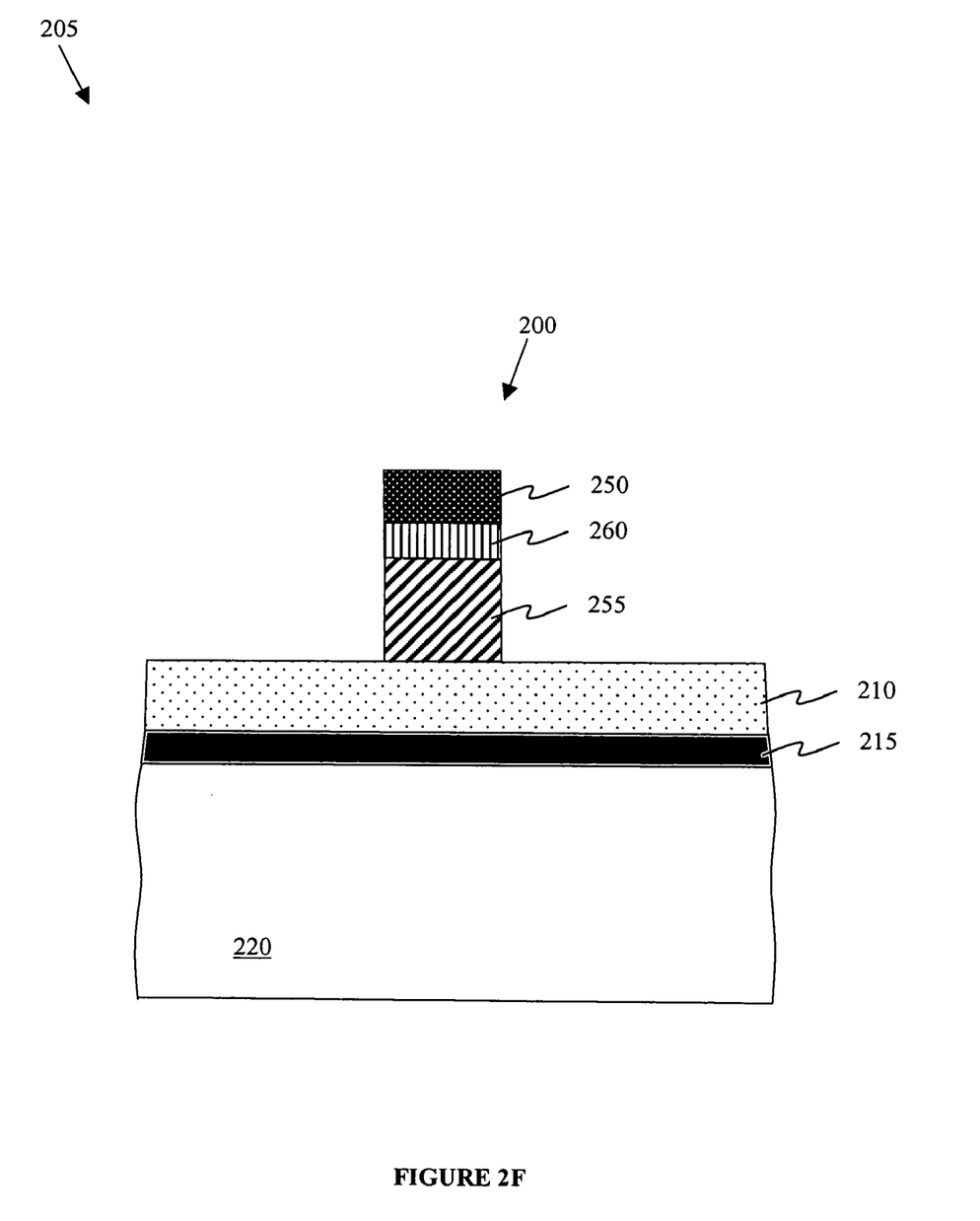

With continuing reference to FIG. 2E, FIG. 2F depicts the partially completed metal gate stack 200 after removing the patterned structure 245, and using the IARC mask 250 as a mask to pattern the protective layer 230 and the polysilicon layer 225, to provide a polysilicon gate layer 255 having a protective layer mask 260 thereon. In some preferred embodiments, in one step, the IARC mask 250 is used as a mask to pattern the protective layer 230 only, and in another step, the IARC mask 250 and patterned protective layer mask 260 are used as a mask to pattern the polysilicon layer 225. This two-step removal process can advantageously avoid erosion of the IARC mask 250 during patterning of the protective layer 230.

Any conventional processes can be used to remove portions of the protective layer 230 and the polysilicon layer 225 that are not covered by the IARC mask 250. As noted above, the protective layer 230 and the polysilicon layer 225 can be removed together in one step or in separate steps. In some cases, where the protective layer 230 comprises silicon dioxide, the patterning of the protective layer 230 can be achieved using a wet HF etch. More preferably, however, patterning of the protective layer 230 is achieved using an anisotropic plasma etch process, as this is conducive to maintaining the dimensions of the protective layer mask 260 to thereby define the dimensions of the completed metal gate stack 200.

In some embodiments, the polysilicon layer 225 can also be patterned using a plasma etch process. As well understood by those skilled in the art, it can be advantageous for the plasma etch process for polysilicon to include HBr, oxygen, or other elements. In some preferred embodiments, the plasma etch process for the polysilicon layer 225 is a multi-step process, for instance a rapid removal step to facilitate the bulk removal of polysilicon, followed by one or more slower removal steps.

Figure 2G:
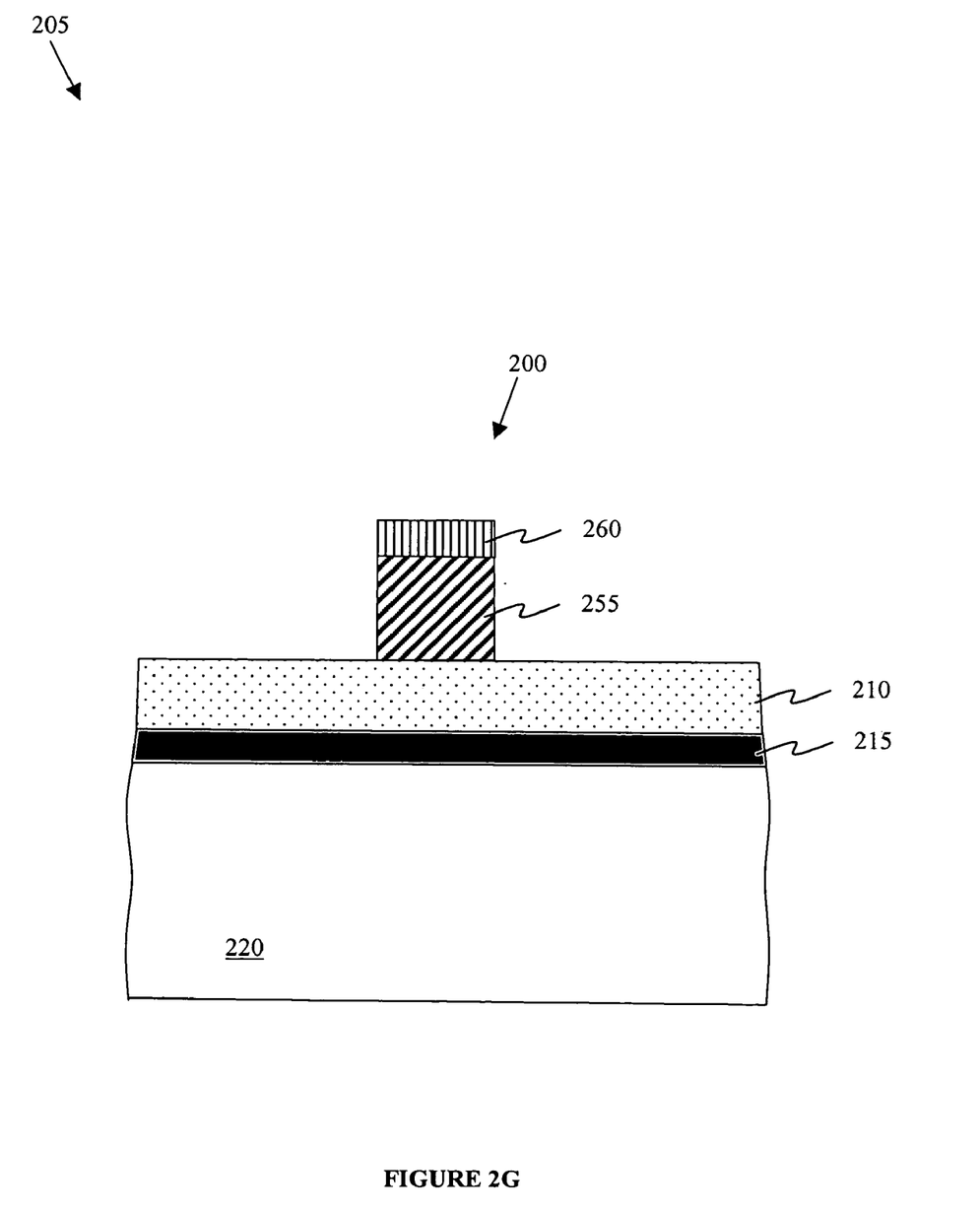

With continuing reference to FIG. 2F, FIG. 2G illustrates the partially completed metal gate stack 200 after stripping off the IARC mask 250, to thereby expose the protective layer mask 260. It is advantageous to strip off the IARC mask 250 while the metal layer 210 remains substantially intact, because the metal layer can protect the underlying gate dielectric layer 215 and substrate from recessing due to the IARC stripping procedure. As noted above, it is preferable for the procedure used for stripping to be selective to the removal of the IARC mask 250 over the protective layer mask 260, so that the protective layer mask 260 remains substantially intact.

In some embodiments, stripping is performed using a dry chemical etch process. As an example, the dry chemical etch process can include mixing a fluorocarbon (e.g., tetrafluoromethane), oxygen and nitrogen gas in a microwave plasma. One of ordinary skill in the art would understand how to adjust the selectively of the dry chemical etch process to achieve a higher etch rate for the IARC mask 250 as compared to the etch rate of the protective layer mask 260. For example, in some preferred embodiments, the dry chemical etch process has a selective etch rate of the IARC mask 250 to the protective layer mask 260 of at least about 2:1, and more preferably, at least about 10:1. Although discussed in the context of selectively removing the IARC mask 250, it should be understood that substantially the same dry chemical etch process can be used for patterning the IARC 235, shown in FIG. 2E.

Figure 2H:
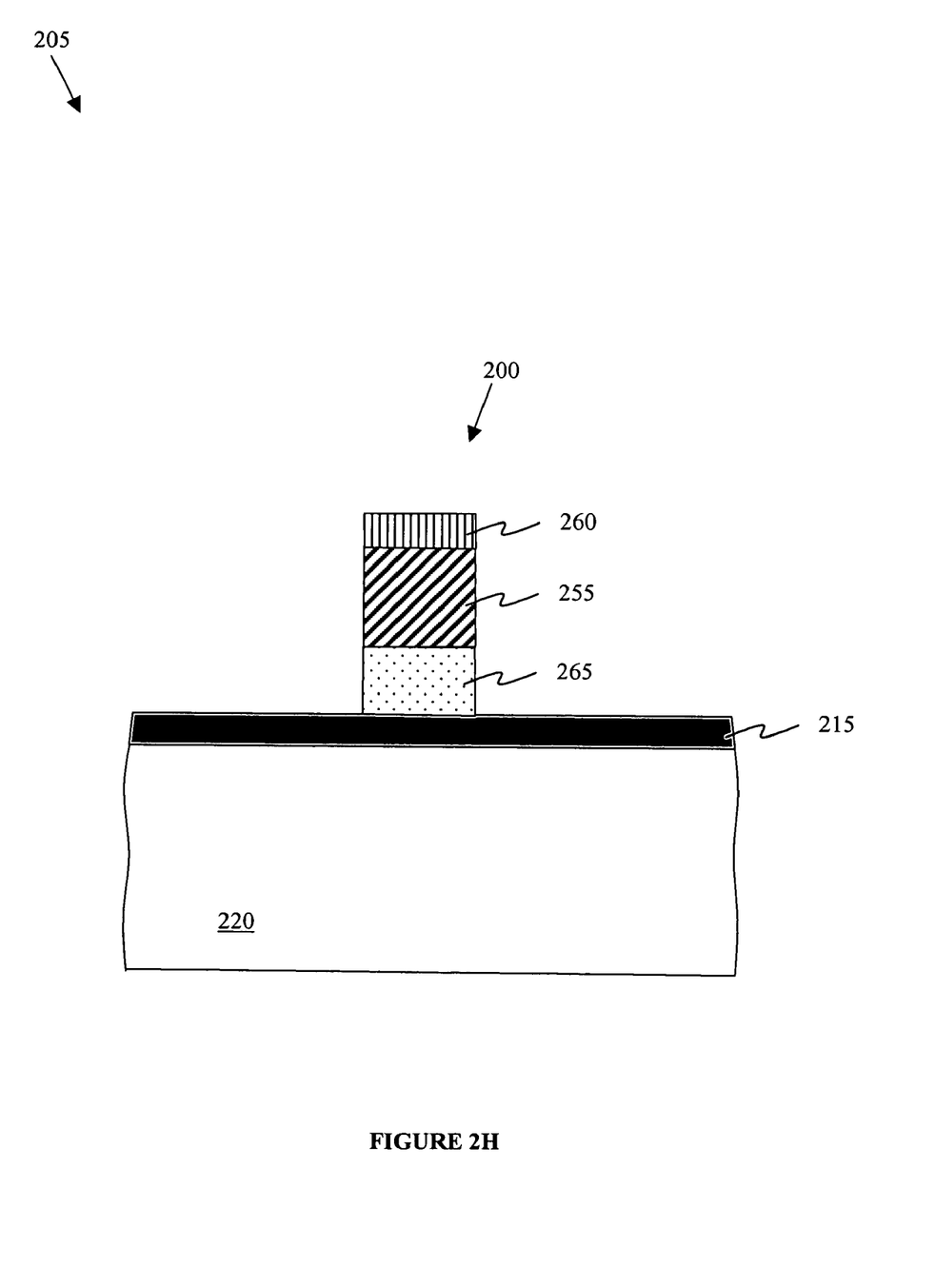

With continuing reference to FIG. 2G, FIG. 2H presents the partially completed metal gate stack 200 after patterning the metal layer 210 using the protective mask 260 as an etch mask, thereby providing a metal gate layer 265. Any conventional etch process can be used for metal patterning. In some preferred embodiments, a plasma etch process that includes a first argon plasma etch followed by a second plasma etch, using halogen dry etch chemistries, such as HBr, is used. Of course, one skilled in the art would understand how to adjust the metal layer etch process to be sufficiently selective to the metal layer 210 over the gate dielectric layer 215 and substrate 220, that there is no substantial recessing of the substrate 220.

Figure 2I:
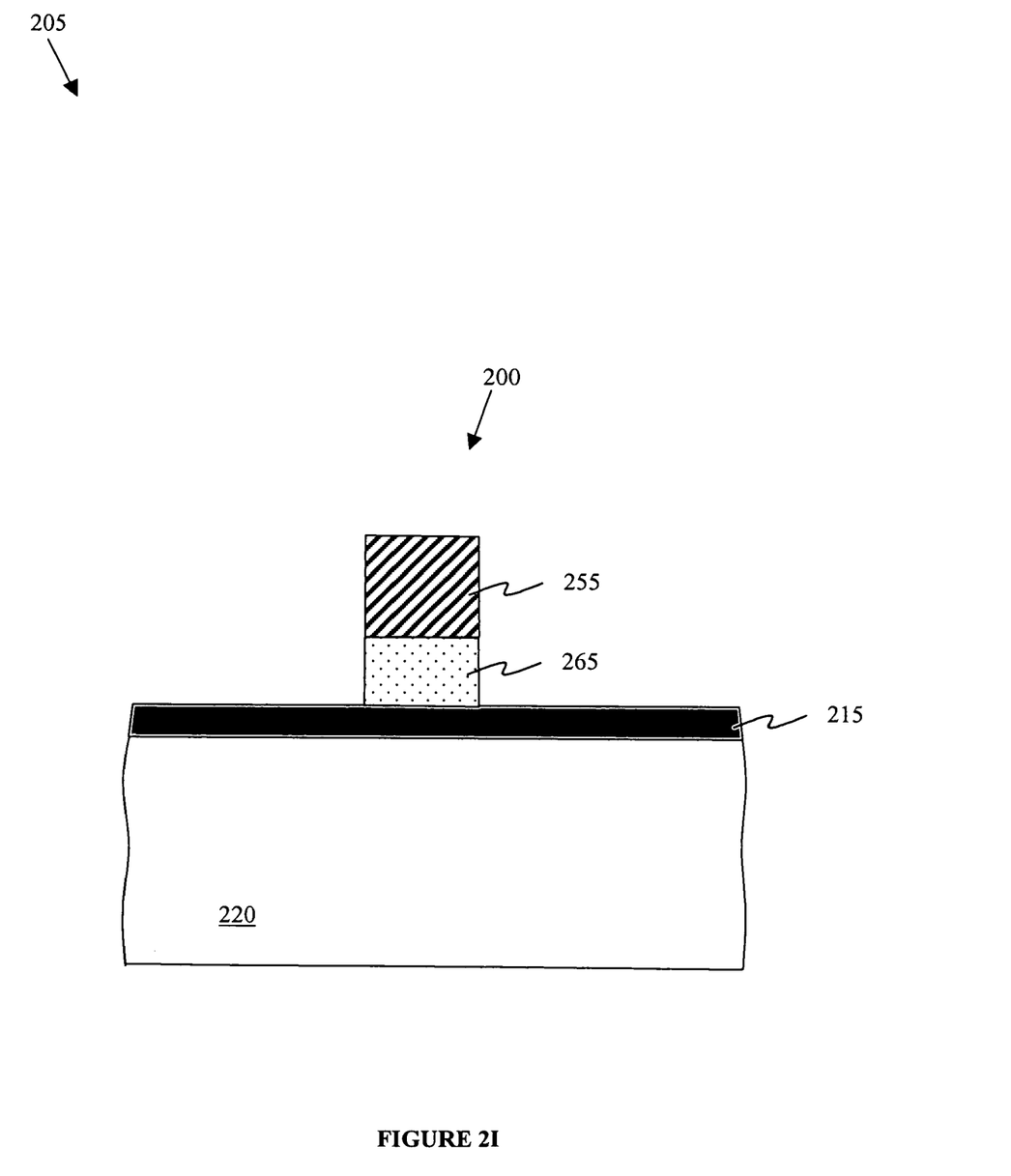

With continuing reference to FIG. 2H, FIG. 2I shows the partially completed metal gate stack 200 after removing the protective layer mask 260 using a removal agent that is substantially non-corrosive to the semiconductor substrate 220, gate dielectric layer 215, and metal gate layer 265. In some cases, for instance, the removal agent is a wet etch, such as a HF bath. In some advantageous embodiments, where the protective layer mask 260 is silicon dioxide, the removal of the protective layer mask 260 is performed later on in semiconductor device manufacturing in conjunction with a removal step of other silicon dioxide containing structures, such as a cap oxide layer removal using a wet etch HF bath.

Figure 2J:
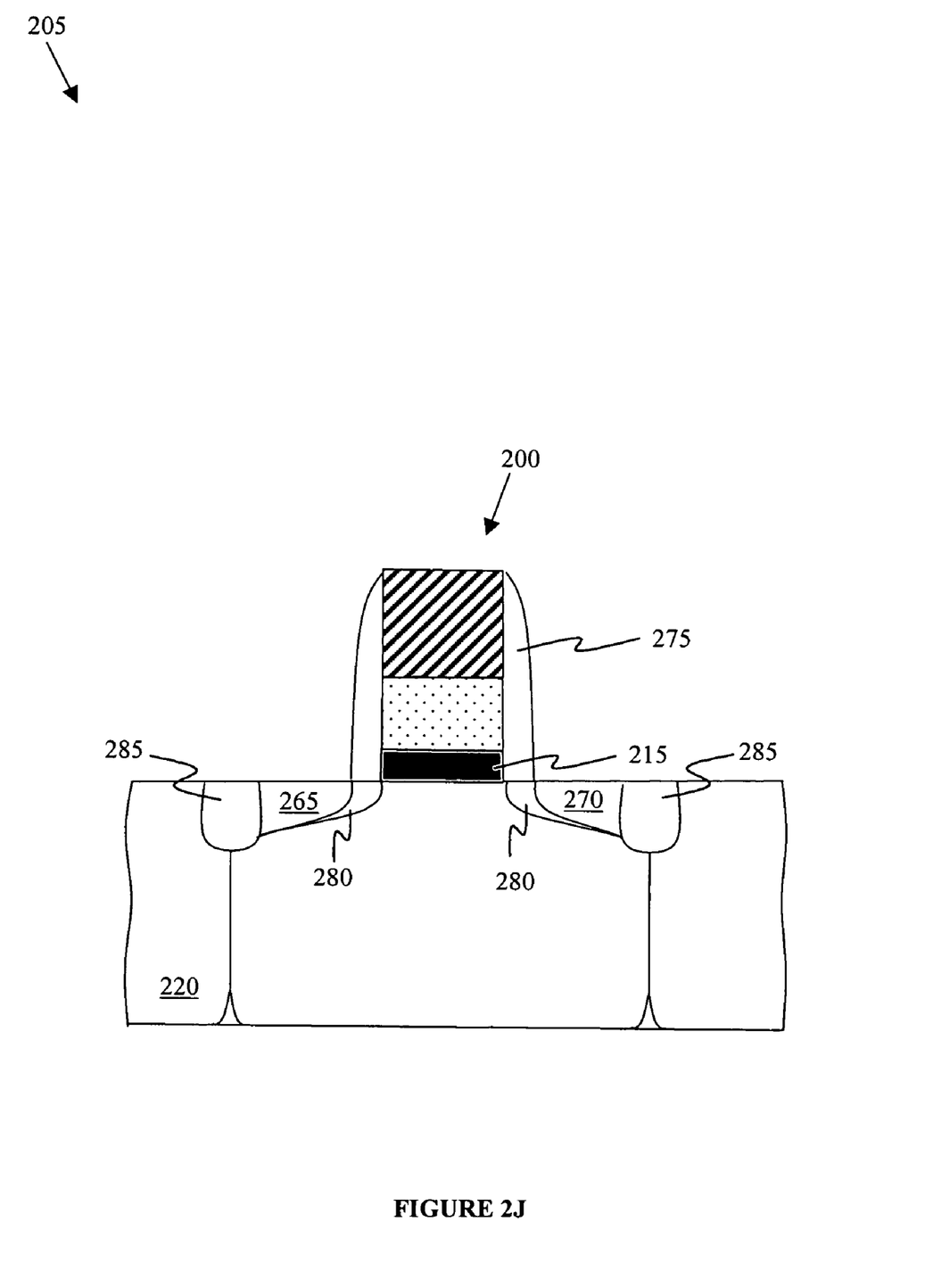

Turning now to FIG. 2J, illustrated is the partially completed metal gate stack 200, after performing additional conventional processing steps necessary to complete the semiconductor device 205 manufacture. Such steps can include implanting dopants, with the metal gate stack 200, serving as an implant mask to facilitate forming source and drain structures 265, 270, forming gate sidewalls 275, shallow junctions 280 and shallow trench isolation structures 285, to form an active device 205.

Figure 3A:
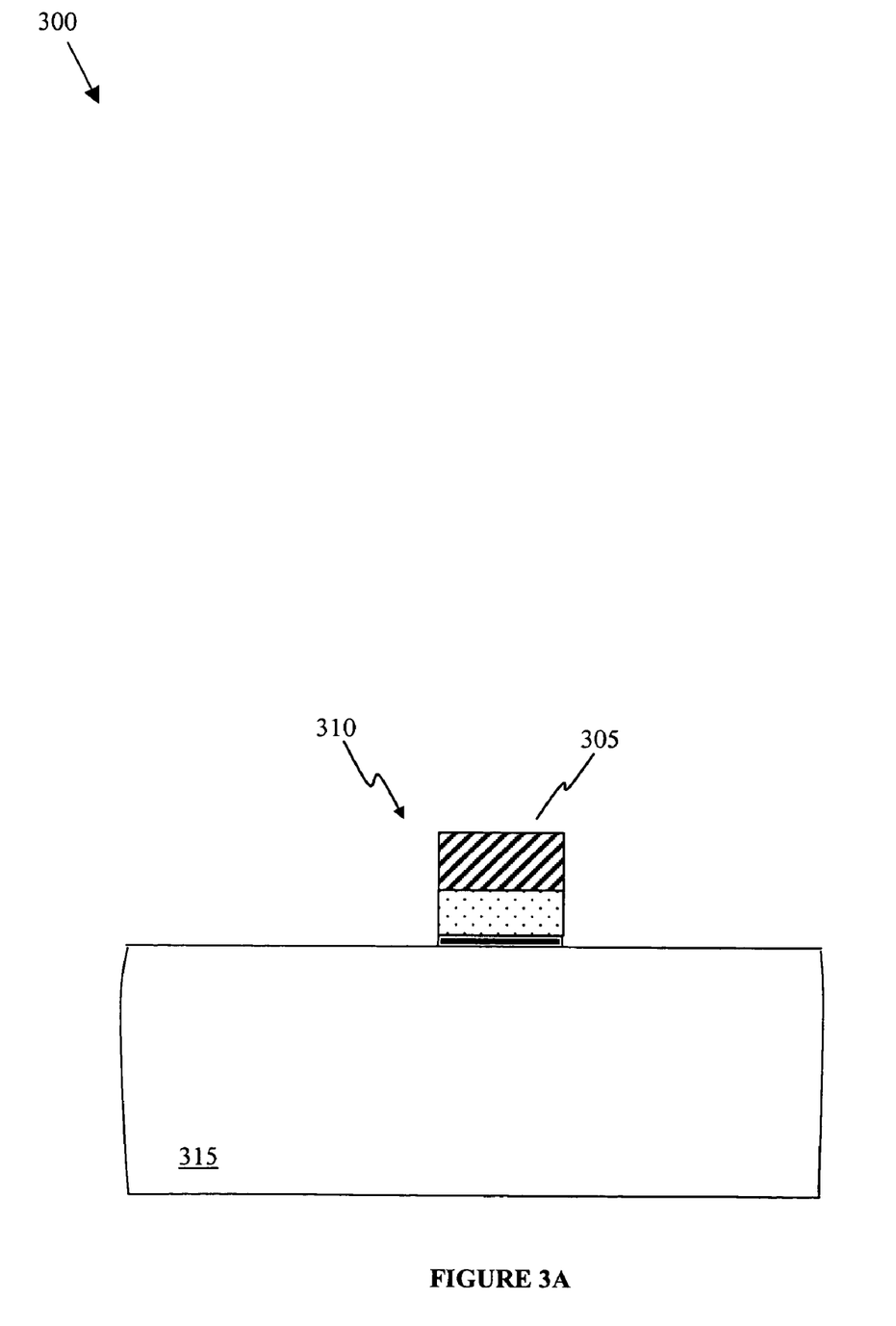
FIGS. 3A to 3C present sectional views of a method for manufacturing an integrated circuit according to the principles of the present invention.
Figure 3B:
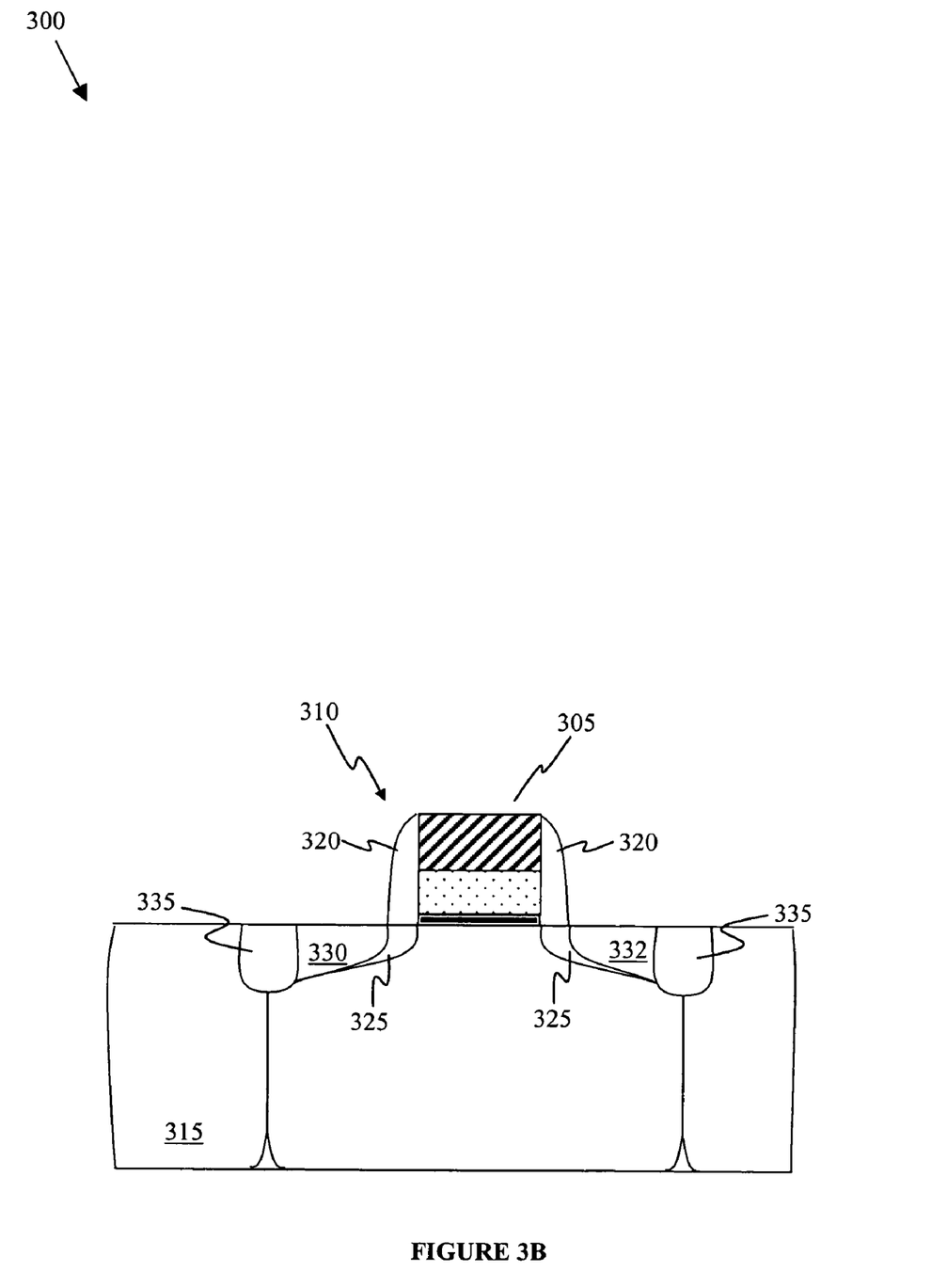
Figure 3C:
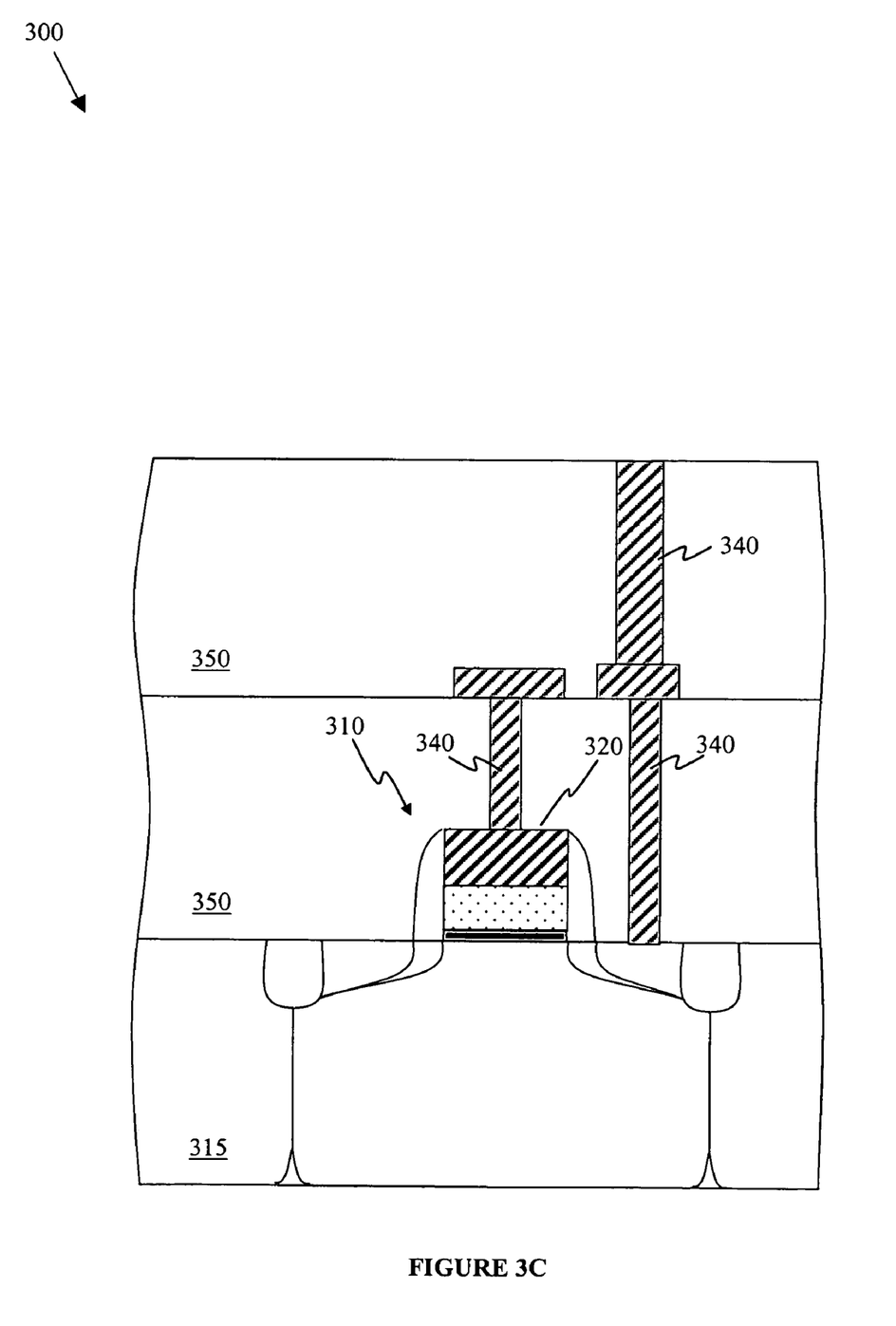

Yet another embodiment of the present invention is a method of manufacturing an integrated circuit. FIGS. 3A to 3C presents sectional views of an exemplary method for manufacturing an integrated circuit 300 according to the principles of the present invention. Turning to FIG. 3A, the method of manufacturing includes forming a metal gate stack 305 in an active device 310, located over or in a semiconductor substrate 315. Any of the above-described processes and structures can be used to form the metal gate stack 305. FIG. 3B depicts the integrated circuit 300, after performing additional steps to complete the active device 310, including the formation of sidewalls 320, shallow junctions 325, source/drain structures 330, 332, and shallow trench isolation structures 335.

Turning now to FIG. 3C, illustrated is the integrated circuit 300, after forming interconnect metal lines 340 in or on one or more insulating layer 350 located over the active device 310. One of ordinary skill would understand that the method may further be extended to form any number of additional interconnects 340 and would also understand how to connect those interconnects 340 with the active device 310 to form an operative integrated circuit 300.

Although the present invention has been described in detail, one of ordinary skill in the art should understand that they can make various changes, substitutions and alterations herein without departing from the scope of the invention.

What is claimed is:

1. A method of fabricating a metal gate stack for a semiconductor device, comprising:

depositing a metal layer over a gate dielectric layer located over a semiconductor substrate;

forming a polysilicon layer over said metal layer;

creating a protective layer over said polysilicon layer;

placing an inorganic anti-reflective coating over said protective layer;

forming a patterned resist layer over said inorganic anti-reflective coating;

etching said inorganic anti-reflective coating and said protective layer using said patterned resist layer as a mask;

etching said polysilicon layer using said inorganic anti-reflective coating as a mask;

after etching said polysilicon layer, stripping said inorganic anti-reflective coating;

after stripping said in-organic anti-reflective coating, etching said metal layer using said protective layer and polysilicon layer as a mask.

2. The method as recited in claim 1, wherein said inorganic antireflective coating is silicon oxynitride and said protective layer is substantially nitrogen-free.

3. The method as recited in claim 1, wherein said protective layer is silicon dioxide.

4. The method as recited in claim 1, wherein said stripping comprises a dry chemical etch process.

5. The method as recited in claim 4, wherein said dry chemical etch process includes mixing a fluorocarbon, oxygen and nitrogen gas in a microwave plasma.

6. The method as recited in claim 4, wherein said dry chemical etch process has a selective etch rate of said inorganic anti-reflective coating to said protective layer of at least about 2:1.

7. The method as recited in claim 1, wherein said protective layer remains substantially intact during said inorganic anti-reflective coating stripping.

8. The method as recited in claim 1, further including removing said protective layer using a removal agent that is substantially non-corrosive to said semiconductor substrate, said gate dielectric layer, and said metal layer.

* * * * *